US012426372B2

(12) United States Patent
Chen (10) Patent No.: US 12,426,372 B2
(45) Date of Patent: Sep. 23, 2025

(54) DISPLAY PANEL AND ELECTRONIC DEVICE

(71) Applicant: Xiamen Tianma Display Technology Co., Ltd., Xiamen (CN)

(72) Inventor: Xin Chen, Wuhan (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 442 days.

(21) Appl. No.: 18/073,457

(22) Filed: Dec. 1, 2022

(65) Prior Publication Data
US 2024/0088160 A1 Mar. 14, 2024

(30) Foreign Application Priority Data

Sep. 8, 2022 (CN) .......................... 202211093792.2

(51) Int. Cl.
| | | |
|---|---|---|
| H01L 27/12 | (2006.01) | |
| G09G 3/20 | (2006.01) | |
| H10D 86/40 | (2025.01) | |
| H10D 86/60 | (2025.01) | |

(52) U.S. Cl.
CPC .......... *H10D 86/60* (2025.01); *G09G 3/2092* (2013.01); *H10D 86/423* (2025.01); *H10D 86/471* (2025.01); *G09G 2310/0286* (2013.01)

(58) Field of Classification Search
CPC ...... H10D 86/60; H10D 86/423; H10D 86/40; H10D 86/471; H10D 86/431; G09G 3/2092; G09G 5/003; G09G 1/165; G09G 3/20; G09G 2310/0286
See application file for complete search history.

(56) References Cited

U.S. PATENT DOCUMENTS

| | | | |
|---|---|---|---|
| 11,646,326 B2 * | 5/2023 | Xia .......................... | G09G 3/20 257/72 |
| 2021/0193049 A1 * | 6/2021 | Lin ....................... | G09G 3/3291 |
| 2022/0037366 A1 * | 2/2022 | Xia ....................... | H10D 86/021 |
| 2023/0165057 A1 * | 5/2023 | Ko ....................... | H10K 59/126 257/40 |

\* cited by examiner

*Primary Examiner* — Nikolay K Yushin
(74) *Attorney, Agent, or Firm* — Anova Law Group, PLLC (57) ABSTRACT

A display panel includes a substrate, and an array layer disposed on one side of the substrate. The array layer includes a first-type thin film transistor and a second-type thin film transistor. The first active layer of the first-type thin film transistor and a second active layer of the second-type thin film transistor are both metal oxide active layers, and a sub-threshold swing value of the first-type thin film transistor is greater than a sub-threshold swing value of the second-type thin film transistor.

20 Claims, 8 Drawing Sheets

DISPLAY PANEL AND ELECTRONIC DEVICE

CROSS-REFERENCE TO RELATED APPLICATION

This application claims priority to Chinese Application No. 202211093792.2 filed on Sep. 8, 2022, the entire content of which is incorporated herein by reference.

TECHNICAL FIELD

The present disclosure relates to the technical field of display technology and, more specifically, to a display panel and an electronic device.

BACKGROUND

With the development of science and technology, more and more electronic devices with display function are used in people's daily activities, which has brought great convenience to people's daily activities, and these electronic devices are becoming an indispensable and important tool for people.

The main component for the electronic device to realize the display function is the display panel. The display panel includes a plurality of pixels. The pixel includes a light-emitting element and a pixel circuit. The pixel circuit is configured to control the light-emitting element, and the pixel circuit includes a drive transistor and a switch transistor. To ensure the drive performance of the drive transistor and the switching performance of the switch transistor, in conventional technology, the drive transistor adopts the LTPS-type thin film transistor (TFT) and the switch transistor adopts the IGZO TFT.

That is, in conventional technology, the pixel circuit in the pixel adopts two types of TFTs, which leads to complex stacking of film layers for forming the pixel circuit. Further, more masks are needed for the process, which in turn leads to a high manufacturing cost of the display panel.

SUMMARY

One aspect of the present disclosure provides a display panel. The display panel includes a substrate, and an array layer disposed on one side of the substrate. The array layer includes a first-type thin film transistor and a second-type thin film transistor. The first active layer of the first-type thin film transistor and a second active layer of the second-type thin film transistor are both metal oxide active layers, and a sub-threshold swing value of the first-type thin film transistor is greater than a sub-threshold swing value of the second-type thin film transistor.

Another aspect of the present disclosure provides an electronic device. The electronic device includes a display panel. The display panel includes a substrate, and an array layer disposed on one side of the substrate. The array layer includes a first-type thin film transistor and a second-type thin film transistor. The first active layer of the first-type thin film transistor and a second active layer of the second-type thin film transistor are both metal oxide active layers, and a sub-threshold swing value of the first-type thin film transistor is greater than a sub-threshold swing value of the second-type thin film transistor.

The active layers of all thin film transistors in the display panel provided by the embodiments of the present disclosure may be metal oxide active layers, that is, only IGZO-type thin film transistors are used in the display panel. The pixel circuit in the display panel may include one type of thin film transistors, which optimizes the film structure for forming the pixel circuit, reduces the number of masks needed for the process, and further reduces the manufacturing cost of the display panel. Further, the same type of thin film transistors in the display panel may have different sub-threshold swing values. The thin film transistor with a relatively large sub-threshold swing value may be used as the drive transistor of the pixel circuit to ensure the driving capability of the drive transistor. The thin film transistor with a relatively small sub-threshold swing value may be used as the switch transistor of the pixel circuit to ensure the switching performance of the switch transistor. That is, the design of the display panel can greatly simplify the manufacturing process and reduce the manufacturing cost without affecting the display performance of the display panel.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DETAILED DESCRIPTION OF THE EMBODIMENTS

Technical solutions of the present disclosure will be described in detail with reference to the drawings, in which the same numbers refer to the same or similar elements unless otherwise specified. It will be appreciated that the described embodiments represent some, rather than all, of the embodiments of the present disclosure. Other embodiments conceived or derived by those having ordinary skills in the art based on the described embodiments without inventive efforts should fall within the scope of the present disclosure.

Figure 1:
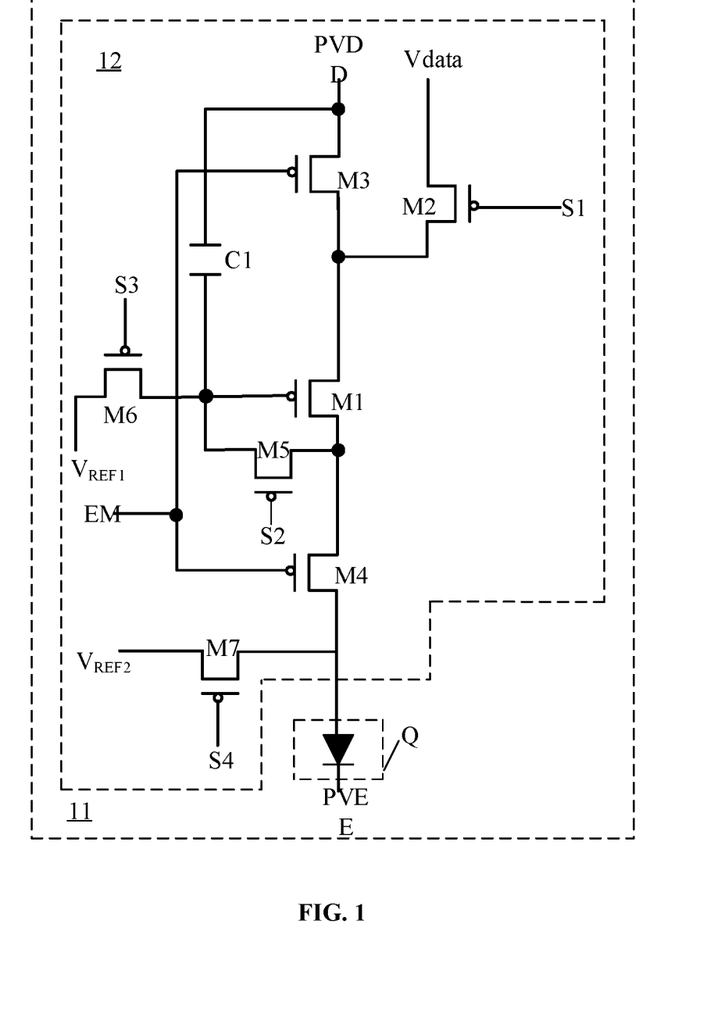
FIG. 1 is a schematic structural diagram of a pixel according to an embodiment of the present disclosure.

FIG. 1 is a schematic structural diagram of a pixel according to an embodiment of the present disclosure. A pixel 11 includes a pixel circuit 12 and a light-emitting element Q. The pixel circuit 12 includes a drive transistor M1 and a plurality of switch transistors (M2-M7). The drive transistor M1 may be configured to generate a drive current, and the light-emitting element Q may respond to the drive current to be in a light-emitting state.

That is, for each pixel 11 of the display panel to emit light, the pixel 11 needs to be controlled by the pixel circuit 12 including thin film transistors and other components integrated on the pixel 11. In the embodiments of the present disclosure, a 7T1C pixel circuit is used as an example for description, but the pixel circuit is not limited in the embodiments of the present disclosure. The pixel circuit may also be other types of pixel circuits. For example, the number of transistors in the pixel circuit may not be limited to 7, the number of capacitors in the pixel circuit may not be limited to 1, and the connection method of the transistors and capacitors in the pixel circuit may not be limited to the configuration shown in FIG. 1. FIG. 1 takes as an example that the transistors in the pixel circuit are all P-type transistors. The transistors in the embodiments of the present disclosure may not limited to be all P-types transistors, and may also be all N-type transistors, or partially P-type transistors and partially N-type transistors.

As shown in FIG. 1, the pixel circuit 12 mainly includes a drive transistor M1 and a plurality of switch transistors (M2-M7). The quality of a thin-film transistor technology is generally measured on its "carrier mobility" and "on-off ratio." The higher the carrier mobility, the lower the power consumption of the screen. The greater the switching ratio, the less likely the display will leak, and the more stable the display panel can be. Based on this, the current mainstream technologies include amorphous silicon (a-Si), low temperature poly-silicon (LTPS), and indium gallium zinc oxide (IGZO).

Amorphous silicon (a-Si) thin film transistor technology has a simple production process and low mobility, and is often used in liquid crystal display (LCD) screens such as computer displays. Low temperature poly-silicon (LTPS) thin film transistor technology is currently the mainstream technology in the display industry. Although the price is relatively high, LTPS has a very high mobility, resulting in very power-saving under high refresh rate. However, the disadvantage of LTPS is that the leakage rate is relatively high in a low refresh rate environment. Although the mobility of indium gallium zinc oxide (IGZO) thin film transistor technology is not as high as that of LTPS, which results in more power consumption under high refresh rate, the excellent on-off ratio of IGZO TFT ensures the stability and low leakage at low refresh rate.

Based on this, the current drive transistor M1 in the pixel circuit 12 can use LTPS-type thin film transistors, and the switch transistors (such as M5 and M6) can use IGZO-type thin film transistors, i.e., the low temperature polycrystalline oxide (LTPO) technology. That is, the two technologies of LTPS and IGZO can be integrated into one pixel circuit, and the two technologies complement each other's shortcomings while also sharing their strengths.

However, using two types of thin film transistors in the pixel circuit 12 in the pixel 11 can result in complicated stacking of film layers for forming the pixel circuit 12. Further, a large number of masks are needed for the process, which in turn leads to a higher manufacturing cost of the display panel.

In view of the foregoing, embodiments of the present disclosure provide a display panel. The active layers of all thin film transistors in the display panel may be metal oxide active layers, that is, only IGZO-type thin film transistors may be used in the display panel. That is, the pixel circuit in the pixel in the display panel may include thin film transistors of one type, which optimizes the film layer structure for forming the pixel circuit, reduces the number of masks needed for the process, and further reduces the manufacturing cost of the display panel. Further, the thin film transistors in the display panel may have different sub-threshold swing values. The thin film transistor with a larger sub-threshold swing value may be used as the drive transistor of the pixel circuit to ensure the driving stability of the drive transistor, and the thin film transistor with a smaller sub-threshold swing value may be used as the switch transistor of the pixel circuit to ensure the switching performance of the switch transistor.

In order to make the objectives, technical solutions, and advantages of the present disclosure clearer, the technical solutions in the embodiments of the present disclosure will be described below with reference to the drawings.

Figure 2:
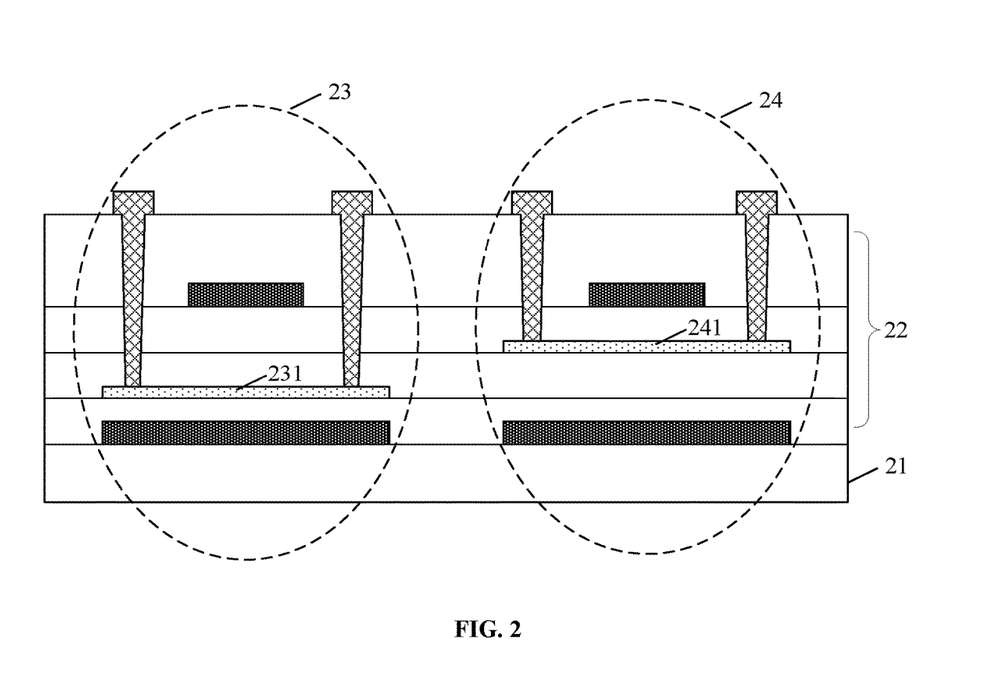
FIG. 2 is a schematic structural diagram of a display panel according to an embodiment of the present disclosure.

FIG. 2 is a schematic structural diagram of a display panel according to an embodiment of the present disclosure. The display panel includes a substrate 21, and an array layer 22 located on one side of the substrate 21, the array layer 22 having a first-type thin film transistor 23 and a second-type thin film transistor 24.

In some embodiments, a first active layer 231 of the first-type thin film transistor 23 and a second active layer 241 of the second-type thin film transistor 24 may both be metal oxide active layers, and the sub-threshold swing value of the first-type thin film transistor 23 may be greater than the sub-threshold swing value of the second-type thin film transistor 24.

In the embodiments of the present disclosure, the first-type thin film transistor 23 may be used as the drive transistor in the pixel circuit 12, and the second-type thin film transistor 24 may be used as the switch transistor in the pixel circuit 12.

In some embodiments, the substrate 21 may include, but is not limited to, a substate of a flexible insulating material with the characteristic of being stretchable or bendable, and its material may include, but is not limited to, polyimide (PI) material, polycarbonate (PC) material, polyethylene terephthalate (PET) material, etc. In other embodiments, the substrate 21 may be a rigid substrate, and the material of the substrate 21 may include, but is not limited to, glass or the like.

In FIG. 2, in the display panel, the first active layer 231 of the first-type thin film transistor 23 may be a metal oxide active layer, and the second active layer 241 of the second-type thin film transistor 24 may also be a metal oxide active layer. That is, the active layers of all thin film transistors in the array layer 22 of the display panel in the embodiments of the present disclosure may be metal oxide active layers. That is, in the display panel in the embodiments of the present disclosure, only IGZO-type thin film transistors may be used, and LTPS-type thin film transistors may not be used. The pixel circuit 12 in the pixels 11 in the display panel may all be composed on IGZO-type thin film transistors. Assume that the pixel circuit is a 7T1C pixel circuit, that is, the seven thin film transistors are all IGZO-type thin film transistors, the film layer structure of the pixel circuit 12 can be optimized, and the number of masks needed for the process can be reduced, reducing the manufacturing cost of the display panel.

The material of the metal oxide active layer may include indium gallium zinc oxide (IGZO), indium tin zinc oxide (ITZO), gallium zinc oxide (GaZnxOy), indium zinc oxide (IZO), zinc magnesium oxide (ZnMgOy), zinc oxide (ZnOx), gallium oxide (GaOx), tin oxide (SnOx), indium oxide (InOx), indium gallium hafnium oxide (IGHO), tin aluminum zinc oxide (TAZO), indium gallium tin oxide (IGTO), etc.

Further, since the conventional IGZO-type thin film transistor cannot meet the driving capability of the drive transistor M1 in the pixel circuit 12, in the embodiments of the present disclosure, the sub-threshold swing value of the first-type thin film transistor 23 may be set to be larger than the sub-threshold swing value of the second-type thin film transistor 24. That is, the display panel may have thin film transistors with different sub-threshold swing values. The first-type thin film transistor 23 with a relatively large sub-threshold swing value may be used as the drive transistor M1 of the pixel circuit 12 to ensure the driving capability of the drive transistor M1. The second-type thin film transistor 24 with a relatively small sub-threshold swing value may be used as the switch transistor of the pixel circuit 12 to ensure the switching performance of the switch transistor. In this case, the effective operation of the pixel circuit 12 can be ensured, the luminous performance of each pixel 11 can be ensured, and the display performance of the display panel can be further ensured.

That is, the display panel provided by the embodiments of the present disclosure can replace the conventional LTPO technology to realize the full IGZO technology without affecting the display performance of the display panel, which greatly simplifies the manufacturing process of the display panel, and further reduces the manufacturing cost.

In some embodiments, the sub-threshold swing value of the first-type thin film transistor 23 may be greater than 0.4 v/dec.

Specifically, in the embodiments of the present disclosure, since the first-type thin film transistor 23 is at least used as the drive transistor M1 in the pixel circuit 12, in order to ensure the driving capability of the first-type thin film transistor 23 as the drive transistor M1, in the design process of the first-type thin film transistor 23, the sub-threshold swing value of the first-type thin film transistor 23 may be set to be greater than 0.4 v/dec. For example, the sub-threshold swing value of the first-type thin film transistor 23 may be set to 0.45 v/dec, 0.5 v/dec, 0.55 v/dec, 0.6 v/dec, etc. to ensure that when the first-type thin film transistor 23 is used as the drive transistor M1, the charging speed when writing the data signal can be accelerated and the stable needed driving current can be output based on the data signal received by the pixel circuit 12, and the light-emitting element can emit the actual needed brightness based on the driving current, thereby ensuring the display performance of the display panel.

In some embodiments, the sub-threshold swing value of the second-type thin film transistor 24 may be less than 0.3 v/dec.

Specifically, in the embodiments of the present disclosure, since the second-type thin film transistor 24 is at least used as a switch transistor in the pixel circuit 12, in order to optimize the switching performance of the second-type thin film transistor 24 as a switch transistor, in the design process of the second-type thin film transistor 24, the sub-threshold swing value of the second-type thin film transistor 24 may be set to be less than 0.3 v/dec. For example, the sub-threshold swing value of the second-type thin film transistor 24 may be 0.25 v/dec, 0.2 v/dec, 0.15 v/dec, 0.1 v/dec, etc. to ensure the working performance of the pixel circuit 12.

Figure 3:
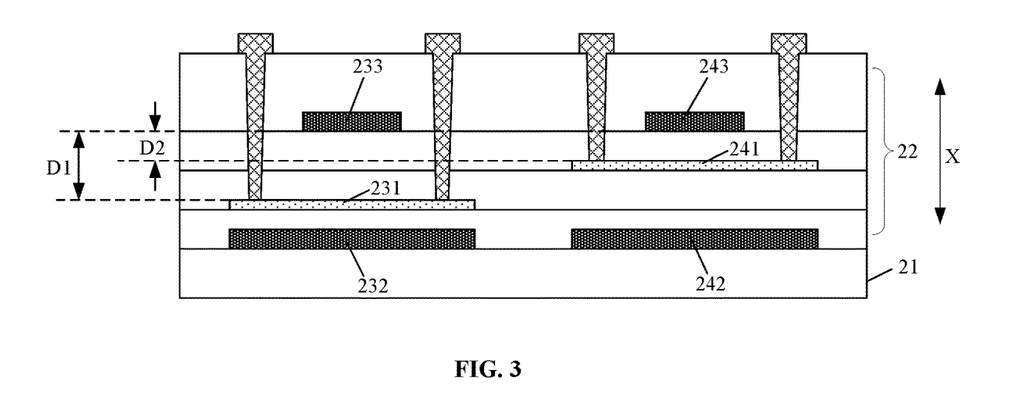
FIG. 3 is a schematic structural diagram of another display panel according to an embodiment of the present disclosure.

FIG. 3 is a schematic structural diagram of another display panel according to an embodiment of the present disclosure. As shown in FIG. 3, the first-type thin film transistor 23 includes a first bottom gate 232 and a first top gate 233 located on two sides of the first active layer 231 in a first direction X, and the first-type thin film transistor 23 includes a second bottom gate 242 and a second top gate 243 located on two sides of the second active layer 241 in the first direction X. In the first direction X, the distance between the first top gate 233 and the first active layer 231 is D1, and the distance between the second top gate 243 and the second active layer 241 is D1. D1 is greater than D2, and the first direction X is perpendicular to the plane where the substrate 21 is located.

In the embodiments of the present disclosure, the first-type thin film transistor 23 is being described by taking a thin film transistor with a double gate structure as an example, and the second-type thin film transistor 24 is also being described by taking a thin film transistor with a double gate structure as an example. The top gate can play a main role and the bottom gate can play as an auxiliary role in the working process of the double gate thin film transistor. Therefore, the distance between the top gate and the active layer is the core factor affecting the sub-threshold swing value of the thin film transistor. Based on this, in the embodiments of the present disclosure, when designing the first-type thin film transistor 23 and the second-type thin film transistor 24, the distance between the first top gate 233 and the first active layer 231 in the first-type thin film transistor 23 may be set to be greater than the distance between the second top gate 243 and the second active layer 241 in the second-type thin film transistor 24, that is D1>D2. In this way, the sub-threshold swing value of the first-type thin film transistor 23 can be ensured to be greater than 0.4 v/dec, thereby ensuring the driving capability of the first-type thin film transistor 23 as the drive transistor M1; and the sub-threshold swing value of the second-type thin film transistor 24 can be ensured to be less than 0.3 v/dec, thereby ensuring the switching performance of the second-type thin film transistor 24 as the switch transistor.

Figure 4:
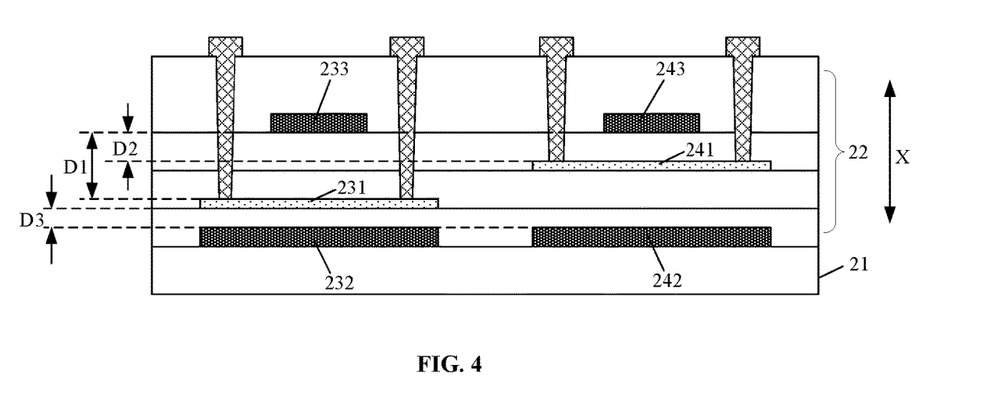
FIG. 4 is a schematic structural diagram of another display panel according to an embodiment of the present disclosure.

FIG. 4 is a schematic structural diagram of another display panel according to an embodiment of the present disclosure. As shown in FIG. 4, in the first direction X, the distance between the first active layer 231 and the first bottom gate 232 is D3, and D1≥2*D3.

In the embodiments of the present disclosure, the first top gate 233 of the first-type thin film transistor 23 with the double gate structure can play a main role, the first bottom gate 232 can play an auxiliary role, and the distance between the first bottom gate 232 and the first active layer 231 can also affect the sub-threshold swing value of the first-type thin film transistor 23. Based on this, in the embodiments of the present disclosure, when designing the first-type thin film transistor 23, the distance between the first top gate 233 and the first active layer 231 in the first-type thin film transistor 23 may be greater than or equal to twice the distance between the first bottom gate 232 and the first active layer 231 in the first-type thin film transistor 23, that is, D1≥2*D3. That is, in the embodiments of the present disclosure, the distance between the first top gate 233 and the first active layer 231 and the distance between the first bottom gate 232 and the first active layer 231 can be considered in conjunction in determining the sub-threshold swing value of the first-type thin film transistor 23. In this way, the sub-threshold swing value of the first-type thin film transistor 23 can be set to be greater than 0.4 v/dec, thereby ensuring the driving capability of the first-type thin film transistor 23 as the drive transistor M1.

Figure 5:
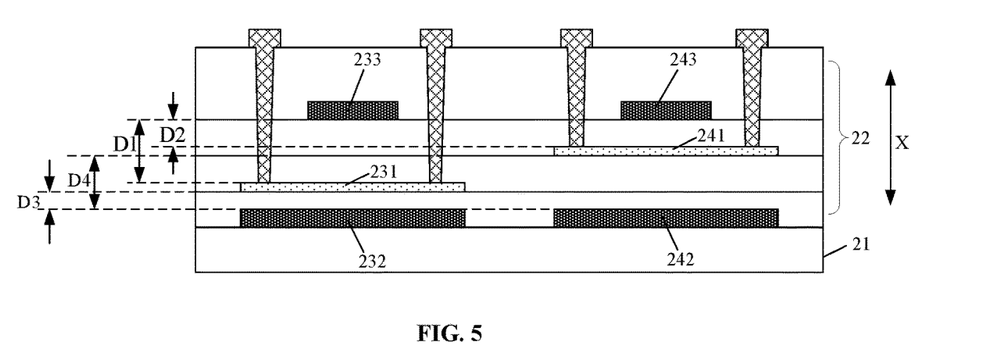
FIG. 5 is a schematic structural diagram of another display panel according to an embodiment of the present disclosure.

FIG. 5 is a schematic structural diagram of another display panel according to an embodiment of the present disclosure. As shown in FIG. 5, in the first direction X, the distance between the second active layer 241 and the second bottom gate 242 is D4, and D2≤D4/2.

In the embodiments of the present disclosure, the second top gate 243 of the second-type thin film transistor 24 with the double gate structure can play a main role, the second bottom gate 242 can play an auxiliary role, and the distance between the second bottom gate 242 and the second active layer 241 can also affect the sub-threshold swing value of the second-type thin film transistor 24. Based on this, in the embodiments of the present disclosure, when designing the second-type thin film transistor 24, the distance between the second top gate 243 and the second active layer 241 in the second-type thin film transistor 24 may be less than or equal to half of the distance between the second bottom gate 242 and the second active layer 241 in the second-type thin film transistor 24, that is, D2≤D4/2. That is, in the embodiments of the present disclosure, the distance between the second bottom gate 242 and the second active layer 241 and the distance between the second top gate 243 and the second active layer 241 can be considered in conjunction in determining the sub-threshold swing value of the second-type thin film transistor 24. In this way, the sub-threshold swing value of the second-type thin film transistor 24 can be set to be less than 0.3 v/dec, thereby ensuring the switching performance of the second-type thin film transistor 24 as a switch transistor.

Figure 6:
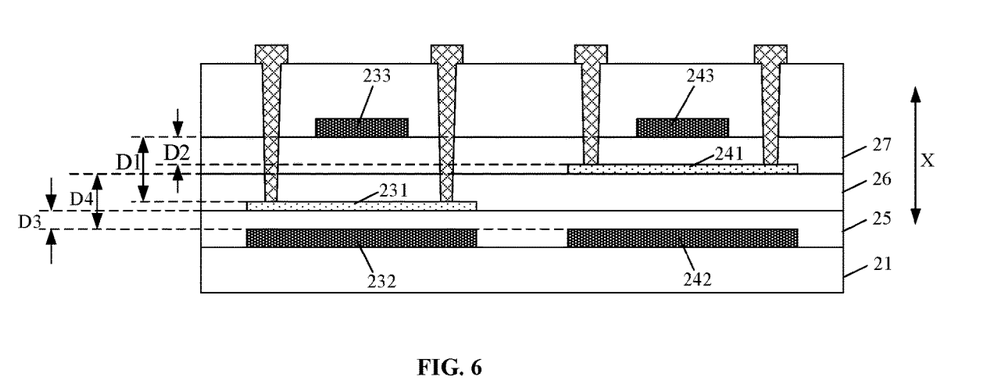
FIG. 6 is a schematic structural diagram of another display panel according to an embodiment of the present disclosure.

FIG. 6 is a schematic structural diagram of another display panel according to an embodiment of the present disclosure. As shown in FIG. 6, the array layer 22 includes a first insulation layer 25, a second insulation layer 26, and a third insulation layer 27. The first bottom gate 232 and the second bottom gate 242 are located on the substrate 21. The first insulation layer 25 is located on the side of the first bottom gate 232 and the second bottom gate 242 away from the substrate 21, and covers the first bottom gate 232 and the second bottom gate 242. The first active layer 231 is located on the side of the first insulation layer 25 away from the substrate 21. The second insulation layer 26 is located on the side of the first active layer 231 away from the substrate 21, and covers the first active layer 231 and the first insulation layer 25. The second active layer 241 is located on the side of the first insulation layer 25 away from the substrate 21. The third insulation layer 27 is located on the side of the second active layer 241 away from the substrate 21, and covers the second active layer 241 and the second insulation layer 26. The first top gate 233 and the second top gate 243 are located on the side of the third insulation layer 27 away from the substrate 21.

In the embodiments of the present disclosure, in the manufacturing process of the first-type thin film transistor 23 and the second-type thin film transistor 24, the first top gate 233 and the second top gate 243 may be caused to be located in the same film layer. That is, the manufacturing process of the first top gate 233 and the second top gate 243 may be realized in one process. Further, the first bottom gate 232 and the second bottom gate 242 may also be caused to be located in the same film layer. That is, the manufacturing process of the first bottom gate 232 and the second bottom gate 242 may also be realized in one process. In this way, to satisfy the distance requirements between the first top gate 233 and the first active layer 231 and between the first bottom gate 232 and the first active layer 231, and the distance requirements between the second top gate 243 and the second active layer 241 and between the second bottom gate 242 and the second active layer 241, the first active layer 231 and the second active layer 241 can be placed in different layers.

That is, in the embodiments of the present disclosure, based on the first active layer 231 and the second active layer 241 being in different layers as shown in FIG. 6, the distances of D1, D2, D3, and D4 can be adjusted to meet the requirements, and the number of masks in the manufacturing process of the array layer 22 can be reduced, thereby reducing the difficulty and cost in manufacturing the display panel.

Figure 7:
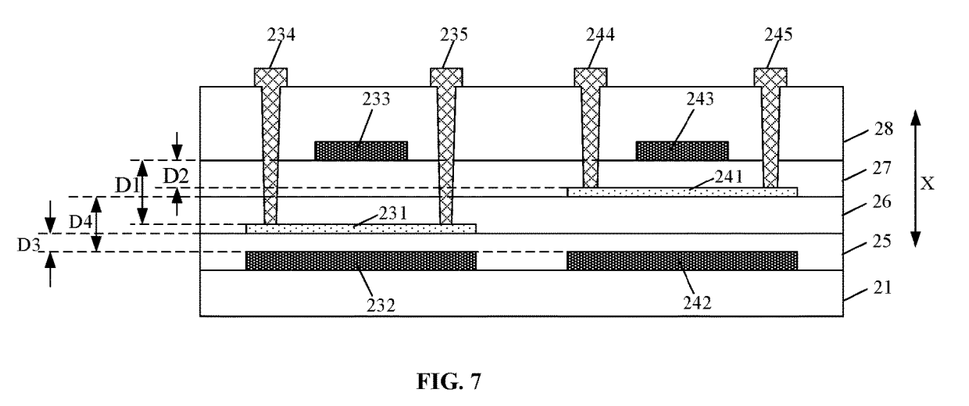
FIG. 7 is a schematic structural diagram of another display panel according to an embodiment of the present disclosure.

FIG. 7 is a schematic structural diagram of another display panel according to an embodiment of the present disclosure. As shown in FIG. 7, the array layer 22 further includes a fourth insulation layer 28. The fourth insulation layer 28 is located on the side of the first top gate 233 and the second top gate 243 away from the substrate 21, and covers the first top gate 233, the second top gate 243, and the third insulation layer 27. As shown in FIG. 7, the first-type thin film transistor 23 further includes a first source electrode 234 and a first drain electrode 235, and the second-type thin film transistor 24 further includes a second source electrode 244 and a second drain electrode 245. The first source electrode 234, the second source electrode 244, the first drain electrode 235, and the second drain electrode 245 may be located on the side of the fourth insulation layer 28 away from the substrate 21. The first source electrode 234 and the first drain electrode 235 are connected to the first active layer 231, and the second source electrode 244 and the second drain electrode 245 are connected to the second active layer 241.

In the embodiments of the present disclosure, for the first-type thin film transistor 23, the first source electrode 234 and the first drain electrode 235 may be located in the same layer, and the first top gate 233 may be located in a different layer. Further, for the second-type thin film transistor 24, the second source electrode 244 and the second drain electrode 245 may be located in the same layer, and the second top gate 243 may be located in a different layer. Since the first top gate 233 of the first-type thin film transistor 23 and the second top gate 243 of the second-type thin film transistor 24 may be located in the same layer, the manufacturing process of the first top gate 233 and the second top gate 243 may be realized in one process. After the first top gate 233 and the second top gate 243 are formed, the patterned first top gate 233 and second top gate 243 may be used as masks to realize the source/drain doping of the first-type thin film transistor 23 and the second-type thin film transistor 24, thereby further simplifying the manufacturing process of the array layer 22.

Figure 8:
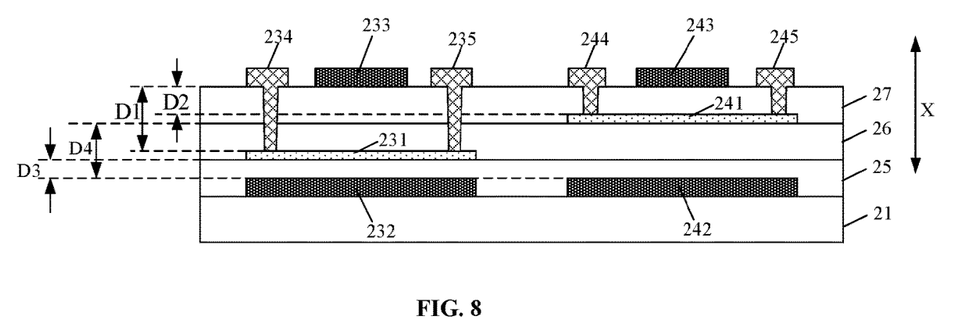
FIG. 8 is a schematic structural diagram of another display panel according to an embodiment of the present disclosure.

FIG. 8 is a schematic structural diagram of another display panel according to an embodiment of the present disclosure. As shown in FIG. 8, the first-type thin film transistor 23 further includes a first source electrode 234 and a first drain electrode 235, and the first source electrode 234 and the first drain electrode 235 are connected to the first active layer 231. The second-type thin film transistor 24 further includes a second source electrode 244 and a second drain electrode 245, and the second source electrode 244 and the second drain electrode 245 are connected to the second active layer 241. The first source electrode 234, the second source electrode 244, the first drain electrode 235, and the second drain electrode 245 are disposed in the same layer as the first top gate 233 and the second top gate 243.

In the embodiments of the present disclosure, for the first-type thin film transistor 23, the first source electrode 234, the first drain electrode 235, and the first top gate 233 may be located in the same layer, and the manufacturing process of the first source electrode 234, the first drain electrode 235, and the first top gate 233 may be realized in one process. For the second-type thin film transistor 24, the second source electrode 244, the second drain electrode 245, and the second top gate 243 may be located in the same layer, and the manufacturing process of the second source electrode 244, the second drain electrode 245, and the second top gate 243 may be realized in one process. Further, for the first-type thin film transistor 23 and the second-type thin film transistor 24, the first source electrode 234, the second source electrode 244, the first drain electrode 235, the second drain electrode 245, the first top gate 233, and the second top gate 243 may be located in the same layer, and the manufacturing process of the first source electrode 234, the second source electrode 244, the first drain electrode 235, the second drain electrode 245, the first top gate 233, and the second top gate 243 may be realized in one process. In this way, a thin film transistor with a source-drain-gate co-layer structure can be realized to reduce the number of masks in the process of manufacturing the array layer 22, thereby reducing the manufacturing difficulty and manufacturing cost of the display panel.

Figure 9:
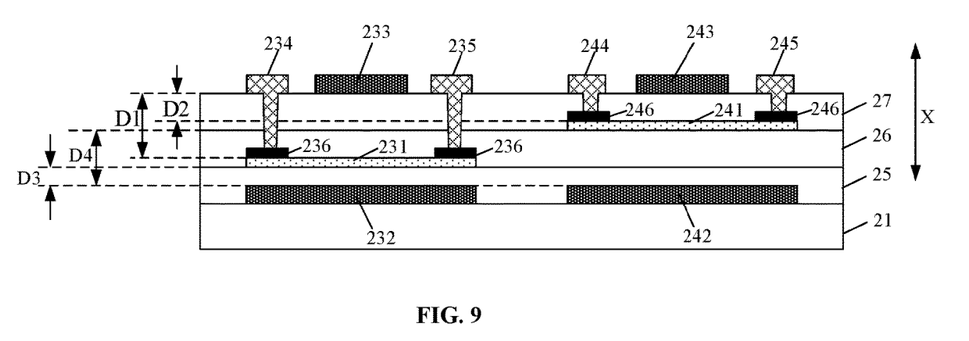
FIG. 9 is a schematic structural diagram of another display panel according to an embodiment of the present disclosure.

FIG. 9 is a schematic structural diagram of another display panel according to an embodiment of the present disclosure. The first-type thin film transistor 23 further includes first ohmic contact layers 236. The first ohmic contact layers 236 are located on the first active layer 231, and the first source electrode 234 and the first drain electrode 235 are respectively connected to the first active layer 231 through the first ohmic contact layers 236. The second-type thin film transistor 24 further includes second ohmic contact layers 246. The second ohmic contact layers 246 are located on the second active layer 241, and the second source electrode 244 and the second drain electrode 245 are respectively connected to the second active layer 241 through the second ohmic contact layers 246.

In the embodiments of the present disclosure, in order to further optimize the film structure of the array layer 22, the first-type thin film transistor 23 and the second-type thin film transistor 24 both adopt the source-drain-gate co-layer structure. In this scenario, the source/drain doping of the first-type thin film transistor 23 and the second-type thin film transistor 24 cannot be realized by using the first top gate 233 and the second top gate 243 as masks. Therefore, in order not to increase the number of masks in the manufacturing process of the array layer 22, and realize the source/drain doping of the first-type thin film transistor 23 and the second-type thin film transistor 24, in the embodiments of the present disclosure, the first ohmic contact layers 236 may be disposed on the first active layer 231 and the second ohmic contact layers 246 may be disposed on the second active layer 241. The first source electrode 234 and the first drain electrode 235 may be respectively connected to the first active layer 231 through the first ohmic contact layers 236, and the second source electrode 244 and the second drain electrode 245 may be respectively connected to the second active layer 241 through the second ohmic contact layers 246. The first ohmic contact layers 236 may from ohmic contacts with the first active layer 231, and the second ohmic contact layers 246 may from ohmic contacts with the second active layer 241.

In some embodiments, the material of the first ohmic contact layers 236 may include, but is not limited to, Mo/Ti alloy, and the material of the second ohmic contact layers 246 may include, but is not limited to, Mo/Ti alloy.

By using the first ohmic contact layers 236 of Mo/Ti alloy and the second ohmic contact layers 246 of Mo/Ti alloy combined with the half tone process, the first ohmic contact layers 236 can form ohmic contacts with the first active layer 231, and the second ohmic contact layers 246 can form ohmic contacts with the second active layer 241. Further, the source/drain doping of the first-type thin film transistor 23 and the second-type thin film transistor 24 can also be achieved without increasing the number of masks.

In some embodiments, the dielectric constant of the second insulation layer 26 may be greater than or equal to twice the dielectric constant of the first insulation layer 25.

In the embodiments of the present disclosure, for the first-type thin film transistor 23 such as shown in FIG. 7 or FIG. 9, the dielectric constant of the first insulation layer 25 between the first bottom gate 232 and the first active layer 231, and the dielectric constant of the second insulation layer 26 between the first active layer 231 and the first top gate 233 may also affect the sub-threshold swing value of the first-type thin film transistor 23. Based on this, in the embodiments of the present disclosure, the dielectric constant of the second insulation layer 26 may be set to be greater than or equal to twice the dielectric constant of the first insulation layer 25 when designing the first-type thin film transistor 23. That is, in the embodiments of the present disclosure, the dielectric constant of the first insulation layer 25 between the first bottom gate 232 and the first active layer 231 and the dielectric constant of the second insulation layer 26 between the first active layer 231 and the first top gate 233 can be considered in conjunction when determining the sub-threshold swing value of the first-type thin film transistor 23. In this way, the sub-threshold swing value of the first-type thin film transistor 23 can be set to be greater than 0.4 v/dec, thereby ensuring the driving capability of the first-type thin film transistor 23 as the drive transistor M1.

In some embodiments, the dielectric constant of the third insulation layer 27 may be greater than or equal to twice the dielectric constant of the first insulation layer 25.

In the embodiments of the present disclosure, for the second-type thin film transistor 24 such as shown in FIG. 7 or FIG. 9, the dielectric constant of the first insulation layer 25 between the second bottom gate 242 and the second active layer 241, and the dielectric constant of the third insulation layer 27 between the second active layer 241 and the second top gate 243 may also affect the sub-threshold swing value of the second-type thin film transistor 24. Based on this, in the embodiments of the present disclosure, the dielectric constant of the third insulation layer 27 may be set to be greater than or equal to twice the dielectric constant of the first insulation layer 25 when designing the second-type thin film transistor 24. That is, in the embodiments of the present disclosure, the dielectric constant of the first insulation layer 25 between the second bottom gate 242 and the second active layer 241 and the dielectric constant of the third insulation layer 27 between the second active layer 241 and the second top gate 243 can be considered in conjunction when determining the sub-threshold swing value of the second-type thin film transistor 24. In this way, the sub-threshold swing value of the second-type thin film transistor 24 can be set to be less than 0.3 v/dec, thereby ensuring the switching performance of the second-type thin film transistor 24 as the switch transistor.

In some embodiments, the material of the first insulation layer 25 may include, but is not limited to, $SiO_x$, the material of the second insulation layer 26 may include, but is not limited to, $SiN_x$, $SiON_x$, $AlO_x$, or $HfO_2$, and the material of the third insulation layer 27 may include, but is not limited to, $SiN_x$, $SiON_x$, $AlO_x$, or $HfO_2$.

In some embodiments, the dielectric constant of the second insulation layer 26 may be greater than the dielectric constant of the first insulation layer 25 and the dielectric constant of the third insulation layer 27.

In some embodiments, the thickness of the second insulation layer 26 may be smaller than the thickness of the first insulation layer 25 and the thickness of the third insulation layer 27.

In the embodiments of the present disclosure, as shown in FIG. 7 or FIG. 9, since the second insulation layer 26 is adjacent to the upper channel of the first-type thin film transistor 23, in order to ensure the mobility of the first-type thin film transistor 23, the dielectric constant of the second insulation layer 26 may be set to be greater than the dielectric constant of the first insulation layer 25 and the dielectric constant of the third insulation layer 27. At the same time, considering the performance of the thin film transistors in the array layer 22, the thickness of the second insulation layer 26 needs to be optimized, to set the thickness of the second insulation layer 26 to be smaller than the thickness of the first insulation layer 25 and the thickness of the third insulation layer 27.

That is, in the embodiments of the present disclosure, under the condition of meeting the relationship among the distance D1, the distance D2, the distance D3, and the distance D4, the thicknesses of the first insulation layer 25, the second insulation layer 26, and the third insulation layer 27 can be reasonably optimized to achieve a "balanced" state, thereby optimizing the performance of the thin film transistors in the array layer 22.

Figure 10:
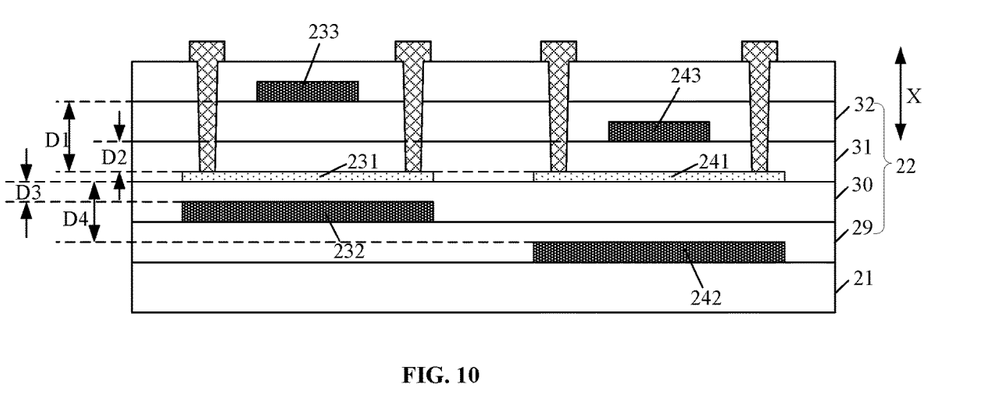
FIG. 10 is a schematic structural diagram of another display panel according to an embodiment of the present disclosure.

FIG. 10 is a schematic structural diagram of another display panel according to an embodiment of the present disclosure. As shown in FIG. 10, the array layer 22 includes a fifth insulation layer 29, a sixth insulation layer 30, a seventh insulation layer 31, and an eighth insulation layer 32. The second bottom gate 242 is located on the substrate 21. The fifth insulation layer 29 is located on the side of the second bottom gate 242 away from the substrate 21, and covers the second bottom gate 242. The first bottom gate 232 is located on the side of the fifth insulation layer 29 away from the substrate 21. The sixth insulation layer 30 is located on the side of the first bottom gate 232 away from the substrate 21, and covers the first bottom gate 232 and the fifth insulation layer 29. The first active layer 231 and the second active layer 241 are located on the side of the sixth insulation layer 30 away from the substrate 21. The seventh insulation layer 31 is located on the side of the first active layer 231 and the second active layer 241 away from the substrate 21, and covers the first active layer 231, the second active layer 241, and the sixth insulation layer 30. The second top gate 243 is located on the side of the seventh insulation layer 31 away from the substrate 21. The eighth insulation layer 32 is located on the side of the second top gate 243 away from the substrate 21, and covers the second top gate 243 and the seventh insulation layer 31. The first top gate 233 is located on the side of the eighth insulation layer 32 away from the substrate 21.

In the embodiments of the present disclosure, first active layer 231 in the first-type thin film transistor 23 and the second active layer 241 in the second-type thin film transistor 24 may be disposed in the same layer. By adjusting the positional relationship among the film layers where the first bottom gate 232, the second bottom gate 242, the first top gate 233, and the second top gate 243 are located, the relationships among the distance D1, the distance D2, the distance D3, and the distance D4 may be met. In this way, the sub-threshold swing value of the first-type thin film transistor 23 can be greater than 0.4 v/dec, thereby ensuring the driving capability of the first-type thin film transistor 23 as the drive transistor M1, and the sub-threshold swing value can be less than 0.3 v/dec, thereby ensuring the switching performance of the second-type thin film transistor 24 as the switch transistor.

Figure 11:
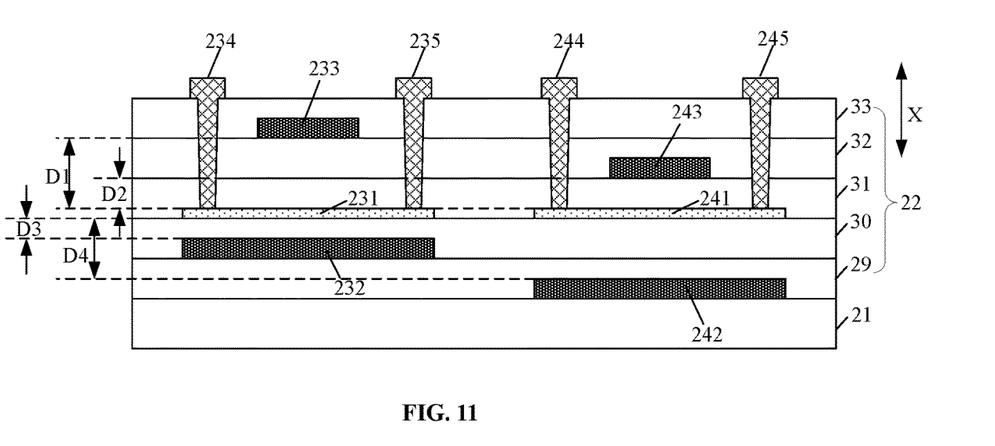
FIG. 11 is a schematic structural diagram of another display panel according to an embodiment of the present disclosure.

FIG. 11 is a schematic structural diagram of another display panel according to an embodiment of the present disclosure. As shown in FIG. 11, the array layer 22 further includes a ninth insulation layer 33. The ninth insulation layer 33 is located on the side of the first top gate 233 away from the substrate 21, and covers the first top gate 233 and the eighth insulation layer 32. The first-type thin film transistor 23 further includes a first source electrode 234 and a first drain electrode 235, and the second-type thin film transistor 24 further includes a second source electrode 244 and a second drain electrode 245. The first source electrode 234, the second source electrode 244, the first drain electrode 235, and the second drain electrode 245 are located on the side of the ninth insulation layer 33 away from the substrate 21. The first source electrode 234 and the first drain electrode 235 are connected to the first active layer 231, and the second source electrode 244 and the second drain electrode 245 are connected to the second active layer 241.

In the embodiments of the present disclosure, for the first-type thin film transistor 23, the first source electrode 234 and the first drain electrode 235 may be located in the same layer, which may be different from the layer of the first top gate 233. For the second-type thin film transistor 24, the second source electrode 244 and the second drain electrode 245 may be located in the same layer, which may be different from the layer of the second top gate 243. Therefore, after the second top gate 243 is formed, the source/drain doping of the second-type thin film transistor 24 may be realized based on the patterned second top gate 243 as a mask. Further, after the first top gate 233 is formed, the source/drain doping of the first-type thin film transistor 23 may be realized using the patterned first top gate 233 as a mask. In this way, the manufacturing process of the array layer 22 can be further simplified, thereby reducing the number of masks for manufacturing the display panel and reducing the manufacturing cost of the display panel.

Figure 12:
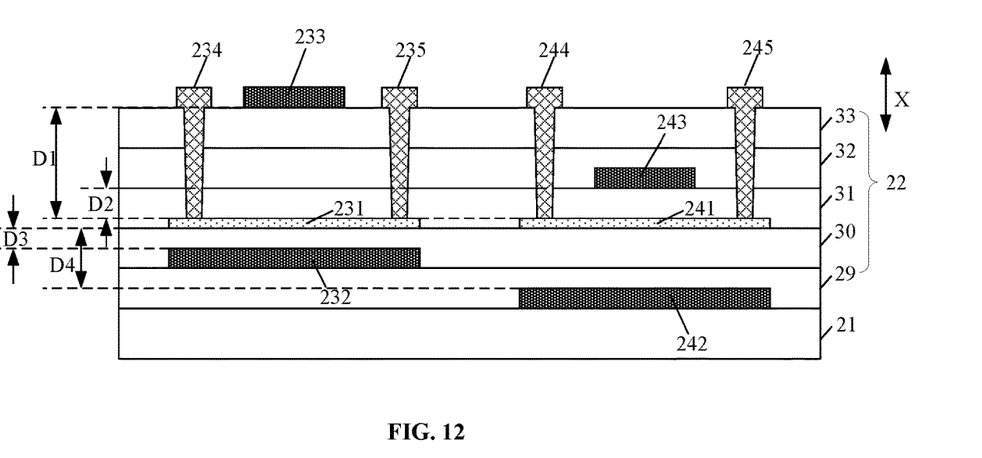
FIG. 12 is a schematic structural diagram of another display panel according to an embodiment of the present disclosure.

FIG. 12 is a schematic structural diagram of another display panel according to an embodiment of the present disclosure. As shown in FIG. 12, the first-type thin film transistor 23 further includes a first source electrode 234 and a first drain electrode 235, and the first source electrode 234 and the first drain electrode 235 are connected to the first active layer 231. The second-type thin film transistor 24 further includes a second source electrode 244 and a second drain electrode 245, and the second source electrode 244 and the second drain electrode 245 are connected to the second active layer 241. The first source electrode 234, the second source electrode 244, the first drain electrode 235, and the second drain electrode 245 are located in the same layer as the first top gate 233.

In the embodiments of the present disclosure, for the first-type thin film transistor 23, the first source electrode 234, the first drain electrode 235, and the first top gate 233 may be located in the same layer. That is, the manufacturing processes of the first source electrode 234, the first drain electrode 235, and the first top gate 233 may be realized in one process. For the second-type thin film transistor 24, the second source electrode 244 and the second drain electrode 245 may be located in the same layer. That is, the manufacturing processes of the second source electrode 244 and the second drain electrode 245 may be realized in one process. For the first-type thin film transistor 23 and the second-type thin film transistor 24, the first source electrode 234, the second source electrode 244, the first drain electrode 235, the second drain electrode 245, and the first top gate 233 may be all located in the same layer. That is, the manufacturing processes of the first source electrode 234, the second source electrode 244, the first drain electrode 235, the second drain electrode 245, and the first top gate 233 may be realized in one process. In this way, the thin film transistor structure with the source-drain-gate co-layer of the thin film transistors can be realized, thereby reducing the number of masks during the manufacturing process of the array layer 22 and reducing the manufacturing difficulty and manufacturing cost of the display panel.

Figure 13:
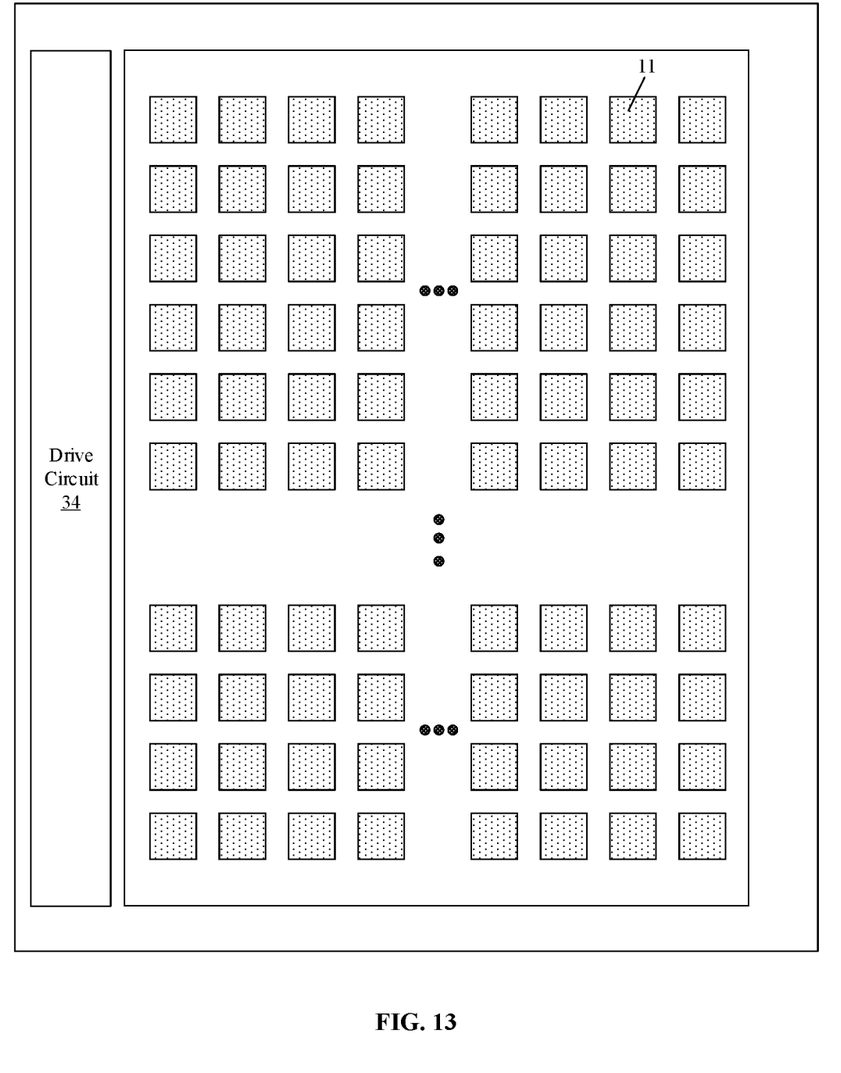
FIG. 13 is a schematic structural diagram of another display panel according to an embodiment of the present disclosure.

FIG. 13 is a schematic structural diagram of another display panel according to an embodiment of the present disclosure. As shown in FIG. 13, the display panel further includes a drive circuit 34. The drive circuit 34 may include cascaded shift registers having the first-type thin film transistor 23 and the second-type thin film transistor 24.

In the embodiments of the present disclosure, the drive circuit 34 may be at least used to provide the pixels 11 in the display area with control signals needed for the operation of the pixels 11. Based on the improvement of the thin film transistor in the embodiments of the present disclosure, the first-type thin film transistor 23 and the second-type thin film transistor 24 may also be applied to the shift register in the drive circuit 34 to realize the application of all IGZO-type thin film transistors in the display panel. In this way, the manufacturing process of the display panel can be reduced as a whole, thereby reducing the manufacturing cost of the display panel.

In some embodiments, the drive circuit 34 may include a scan drive circuit and a light-emission control drive circuit.

The first-type thin film transistor 23 and the second-type thin film transistor 24 may also be applied to other circuit structures of the display panel.

Figure 14:
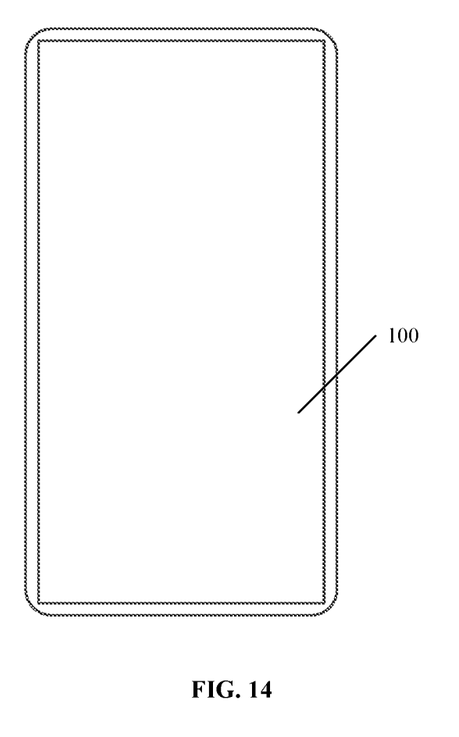
FIG. 14 is a schematic structural diagram of an electronic device according to an embodiment of the present disclosure.

Based on the foregoing embodiments of the present disclosure, an embodiment of the present disclosure further provides an electronic device. FIG. 14 is a schematic structural diagram of an electronic device 100 according to an embodiment of the present disclosure.

The electronic device 100 may include the display panel described in the foregoing embodiments of the present disclosure.

The electronic device 100 may include, but is not limited to, an electronic device such as a mobile phone or a tablet device, and the electronic device may have at least the same or corresponding technical effects as the display panel.

The display panel and the electronic device provided by the embodiments of the disclosure are described above. Specific examples are used to set forth the principles and embodiments of the disclosure. Descriptions of the above embodiments are only used to help understand the method and the core idea of the disclosure; and modifications can be made to those embodiments and applications by those skilled in the art according to the ideal of the disclosure. Therefore, the content of this disclosure should not be construed as limit to the disclosure.

The embodiments in this specification are described in a progressive manner, each embodiment emphasizes a difference from the other embodiments, and the identical or similar parts between the embodiments may be made to reference each other. Since the apparatuses disclosed in the embodiments are corresponding to the methods disclosed in the embodiments, the description of the apparatuses is simple, and for relevant parts, reference can be made to the description of the methods.

In the present disclosure, relational terms such as first and second, etc., are only used to distinguish an entity or operation from another entity or operation, and do not necessarily imply that there is an actual relationship or order between the entities or operations. The terms "comprising," "including," or any other variations are intended to encompass non-exclusive inclusion, such that a process, a method, an apparatus, or a device having a plurality of listed items not only includes these items, but also includes other items that are not listed, or includes items inherent in the process, method, apparatus, or device. Without further limitations, an item modified by a term "comprising a . . . " does not exclude inclusion of another same item in the process, method, apparatus, or device that includes the item.

The description of the disclosed embodiments can enable those skilled in the art to implement the disclosure. Numerous variations can be obvious to those skilled in the art. The technical solutions of the disclosure can be implemented with other embodiments without departing a spirit or a scope of the disclosure. A scope of the disclosure is not limited to the embodiments described hereinabove, but can be interpreted to the widest scope which is consistent with the principles and features disclosed hereinabove.

What is claimed is:

1. A display panel comprising:
   a substrate; and
   an array layer disposed on one side of the substrate, the array layer including a first-type thin film transistor and a second-type thin film transistor;
   wherein a first active layer of the first-type thin film transistor and a second active layer of the second-type thin film transistor are both metal oxide active layers, and a sub-threshold swing value of the first-type thin film transistor is greater than a sub-threshold swing value of the second-type thin film transistor.

2. The display panel of claim 1, wherein:
   the sub-threshold swing value of the first-type thin film transistor is greater than 0.4 v/dec.

3. The display panel of claim 1, wherein:
   the sub-threshold swing value of the second-type thin film transistor is less than 0.3 v/dec.

4. The display panel of claim 1, wherein:
   the first-type thin film transistor is configured as a drive transistor in a pixel circuit, and the second-type thin film transistor is configured as a switch transistor in the pixel circuit.

5. The display panel of claim 1, further comprising:
a drive circuit, the drive circuit including cascaded shift registers, the cascaded shift registers including the first-type thin film transistor and the second-type thin film transistor.

6. An electronic device comprising:
a display panel, the display panel including:
  a substrate; and
  an array layer disposed on one side of the substrate, the array layer including a first-type thin film transistor and a second-type thin film transistor;
  wherein a first active layer of the first-type thin film transistor and a second active layer of the second-type thin film transistor are both metal oxide active layers, and a sub-threshold swing value of the first-type thin film transistor is greater than a sub-threshold swing value of the second-type thin film transistor.

7. The display panel of claim 1, wherein:
the first-type thin film transistor includes a first bottom gate and a first top gate disposed on two sides of the first active layer in a first direction, the first direction being perpendicular to a plane where the substrate is located;
the second-type thin film transistor includes a second bottom gate and a second top gate disposed on two sides of the second active layer in the first direction; and
in the first direction, a distance between the first top gate and the first active layer is D1, a distance between the second top gate and the second active layer is D2, and D1>D2.

8. The display panel of claim 7, wherein:
in the first direction, a distance between the first active layer and the first bottom gate is D3, and D1≥2*D3.

9. The display panel of claim 7, wherein:
in the first direction, a distance between the second active layer and the second bottom gate is D4, and D2≤D4/2.

10. The display panel of claim 7, wherein:
the array layer further includes a first insulation layer, a second insulation layer, a third insulation layer, and a fourth insulation layer;
the second bottom gate is located on the substrate;
the first insulation layer is located on a side of the second bottom gate away from the substrate, and covers the second bottom gate;
the first bottom gate is located on a side of the first insulation layer away from the substrate;
the second insulation layer is located on a side of the first bottom gate away from the substrate, and covers the first bottom gate and the first insulation layer;
the first active layer and the second active layer are located on a side of the second insulation layer away from the substrate;
the third insulation layer is located on a side of the first active layer and the second active layer away from the substrate, and covers the first active layer, the second active layer, and the second insulation layer;
the second top gate is located on a side of the third insulation layer away from the substrate;
the fourth insulation layer is located on a side of the second top gate away from the substrate, and covers the second top gate and the third insulation layer; and
the first top gate is located on a side of the fourth insulation layer away from the substrate.

11. The display panel of claim 10, wherein:
the array layer further includes a fifth insulation layer;
the fifth insulation layer is located on a side of the first top gate away from the substrate, and covers the first top gate and the fourth insulation layer;
the first-type thin film transistor further includes a first source electrode and a first drain electrode, and the second-type thin film transistor further includes a second source electrode and a second drain electrode;
the first source electrode, the second source electrode, the first drain electrode, and the second drain electrode are located on a side of the fifth insulation layer away from the substrate; and
the first source electrode and the first drain electrode are connected to the first active layer, and the second source electrode and the second drain electrode are connected to the second active layer.

12. The display panel of claim 10, wherein:
the first-type thin film transistor further includes a first source electrode and a first drain electrode, and the first source electrode and the first drain electrode are connected to the first active layer;
the second-type thin film transistor further includes a second source electrode and a second drain electrode, and the second source electrode and the second drain electrode are connected to the second active layer; and
the first source electrode, the second source electrode, the first drain electrode, and the second drain electrode are disposed in a same layer as the first top gate.

13. The display panel of claim 7, wherein:
the array layer includes a first insulation layer, a second insulation layer, and a third insulation layer;
the first bottom gate and the second bottom gate are located on the substrate;
the first insulation layer is located on a side of the first bottom gate and the second bottom gate away from the substrate, and covers the first bottom gate and the second bottom gate;
the first active layer is located on a side of the first insulation layer away from the substrate;
the second insulation layer is located on a side of the first active layer away from the substrate, and covers the first active layer and the first insulation layer;
the second active layer is located on a side of the second insulation layer away from the substrate;
the third insulation layer is located on a side of the second active layer away from the substrate, and covers the second active layer and the second insulation layer; and
the first top gate and the second top gate are located on a side of the third insulation layer away from the substrate.

14. The display panel of claim 13, wherein:
the array layer further includes a fourth insulation layer;
the fourth insulation layer is located on a side of the first top gate and the second top gate away from the substrate, and covers the first top gate, the second top gate, and the third insulation layer;
the first-type thin film transistor further includes a first source electrode and a first drain electrode, and the second-type thin film transistor further includes a second source electrode and a second drain electrode;
the first source electrode, the second source electrode, the first drain electrode, and the second drain electrode are located on a side of the fourth insulation layer away from the substrate; and
the first source electrode and the first drain electrode are connected to the first active layer, and the second source electrode and the second drain electrode are connected to the second active layer.

15. The display panel of claim 13, wherein:
a dielectric constant of the second insulation layer is greater than or equal to twice a dielectric constant of the first insulation layer.

16. The display panel of claim 13, wherein:
a dielectric constant of the third insulation layer is greater than or equal to twice a dielectric constant of the first insulation layer.

17. The display panel of claim 13, wherein:
a dielectric constant of the second insulation layer is greater than a dielectric constant of the first insulation layer and a dielectric constant of the third insulation layer.

18. The display panel of claim 13, wherein:
a thickness of the second insulation layer is smaller than a thickness of the first insulation layer and a thickness of the third insulation layer.

19. The display panel of claim 13, wherein:
the first-type thin film transistor further includes a first source electrode and a first drain electrode, and the first source electrode and the first drain electrode are connected to the first active layer;

the second-type thin film transistor further includes a second source electrode and a second drain electrode, and the second source electrode and the second drain electrode are connected to the second active layer; and the first source electrode, the second source electrode, the first drain electrode, and the second drain electrode are disposed in a same layer as the first top gate and the second top gate.

20. The display panel of claim 19, wherein:
the first-type thin film transistor further includes first ohmic contact layers, the first ohmic contact layers being located on the first active layer, the first source electrode and the first drain electrode being respectively connected to the first active layer through the first ohmic contact layers; and the second-type thin film transistor further includes second ohmic contact layers, the second ohmic contact layers being located on the second active layer, the second source electrode and the second drain electrode being respectively connected to the second active layer through the second ohmic contact layers.

* * * * *